(12) United States Patent
Rowhani et al.

(10) Patent No.: US 8,015,419 B2
(45) Date of Patent: Sep. 6, 2011

(54) METHOD AND APPARATUS FOR SOFT START POWER GATING WITH AUTOMATIC VOLTAGE LEVEL DETECTION

(75) Inventors: Omid Rowhani, North York (CA); Vincent Ross, Toronto (CA)

(73) Assignee: ATI Technologies ULC, Markham, Ontario (CA)

( * ) Notice: Subject to any disclaimer, the term of this patent is extended or adjusted under 35 U.S.C. 154(b) by 717 days.

(21) Appl. No.: 11/469,153

(22) Filed: Aug. 31, 2006

(65) Prior Publication Data

US 2008/0059824 A1    Mar. 6, 2008

(51) Int. Cl.
G06F 1/00 (2006.01)
H01L 25/00 (2006.01)
H03K 17/00 (2006.01)

(52) U.S. Cl. ....... 713/300; 713/324; 713/340; 326/102; 327/365

(58) Field of Classification Search .......... 713/300, 713/324, 340; 326/102; 327/365
See application file for complete search history.

(56) References Cited

U.S. PATENT DOCUMENTS

| | | | |
|---|---|---|---|
| 4,906,867 A * | 3/1990 | Petty ............................ | 326/27 |
| 6,333,650 B1 * | 12/2001 | Amin et al. .................... | 327/143 |
| 6,465,993 B1 * | 10/2002 | Clarkin et al. ................. | 323/272 |
| 6,597,157 B1 * | 7/2003 | Boeckmann et al. ......... | 323/242 |
| 6,785,161 B2 * | 8/2004 | Pekny ....................... | 365/185.18 |
| 6,937,086 B1 | 8/2005 | You et al. | |
| 7,142,019 B2 * | 11/2006 | Mair et al. ..................... | 326/96 |
| 7,230,452 B2 * | 6/2007 | Hoon et al. ..................... | 326/83 |
| 7,380,146 B2 * | 5/2008 | Swope .......................... | 713/320 |
| 7,401,243 B2 * | 7/2008 | Knepper et al. ............. | 713/322 |
| 7,511,528 B2 * | 3/2009 | Arsovski et al. ................ | 326/27 |
| 2006/0061395 A1 | 3/2006 | Noto et al. | |

FOREIGN PATENT DOCUMENTS

EP    1391803 A1    2/2004

OTHER PUBLICATIONS

Chitwoood, Sam, "IR Drop in High-Speed IC Packages and PCBs," Printed Circuit Design & Manufacture, Apr. 2005, pp. 16-18.
Kim, Suhwan, "Understanding and Minimizing Ground Bounce During Mode Transition of Power Gating Structures," ISPLED, Aug. 23, 2003, Seoul, Korea, pp. 22-25.
Biggs, John et al.; Aggressive Leakage Management in ARM Based Systems; SNUG Boston 2006; pp. 1-20.
EP Examination Report; EP Application No. 07825348.1; dated Jun. 25, 2009.

* cited by examiner

*Primary Examiner* — Stefan Stoynov
(74) *Attorney, Agent, or Firm* — Vedder Price P.C.

(57) ABSTRACT

A method and apparatus for selectively charging a secondary voltage rail includes selectively and partially charging a secondary voltage rail using at least one soft start power gate switch and using an initial power control indicator. The partially charged secondary voltage rail is selectively charged, using at least one main power gate switch, based on the initial power control indicator and a detected voltage on the secondary voltage rail. When the initial power control indicator is in a state representative of an initial power up command and when the detected voltage is greater than or equal to a predetermined voltage level, at least one main power gate switch is closed thereby charging the secondary voltage rail.

29 Claims, 11 Drawing Sheets

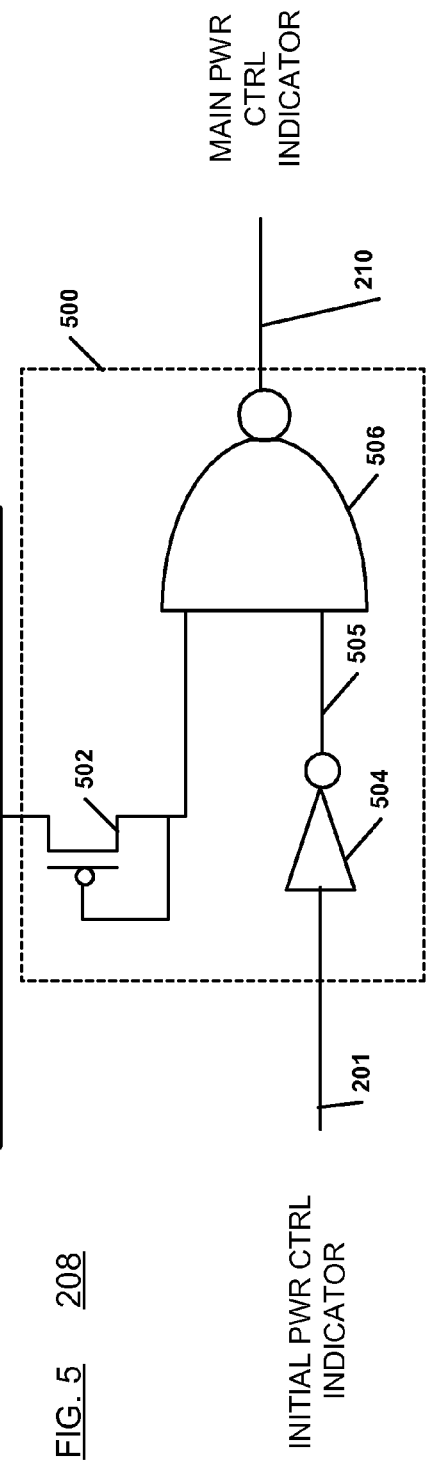
FIG. 5    208
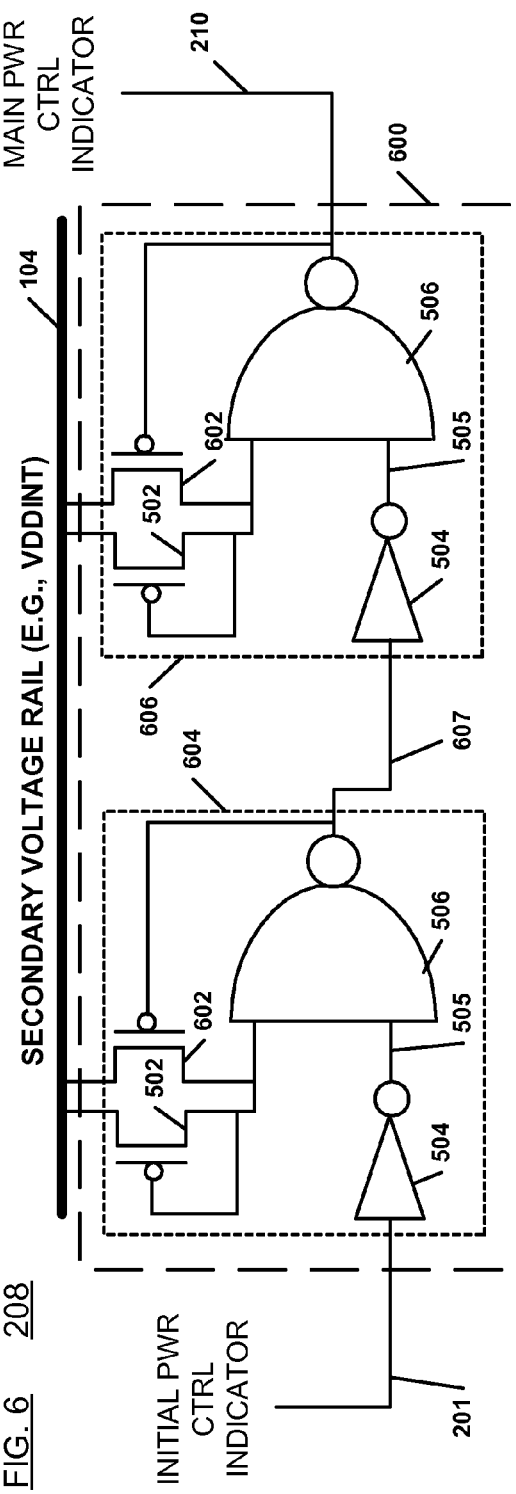
FIG. 6    208

METHOD AND APPARATUS FOR SOFT START POWER GATING WITH AUTOMATIC VOLTAGE LEVEL DETECTION

FIELD OF THE INVENTION

The invention generally relates to charging a secondary voltage rail and, more particularly, to using power gating structures to charge a secondary voltage rail.

BACKGROUND OF THE INVENTION

The use of secondary voltage rails in an integrated circuit ("IC") is well known to selectively control the voltage supplied to one or more IC components. For instance, an IC may include one or more first power rails (e.g., one or more main power rails) that provides power to the entire IC. The first power rail may be powered externally by either a battery or by a power supply directly connected to a power distribution service. When the device is turned on, power from the battery or the power supply connects to the IC and charges the first power rail(s). Instead of connecting all IC components to the first power rail, one or more components of the IC may be connected to a secondary voltage rail that is selectively switched on or off using a selectively controllable switch.

This ability to selectively switch components on or off in an IC is particularly important in handheld devices including, but not limited to, cell phones, personal digital assistants, portable entertainment systems, etc. In such handheld devices, reducing the net power consumption of the device lengthens the amount of time between charges (or between replacement) of a battery power source. However, it is recognized that the selective ability to switch components on or off in an IC is also important to traditional computer systems that are not dependent upon a battery source. For instance, laptops are often designed to dissipate the least amount of heat so that the user is comfortable placing the system on her lap. It may further be valuable to reduce the net power consumed on a traditional computer system, thereby limiting the amount of fossil fuels consumed to generate the necessary electricity to power traditional computer systems. It is further recognized that the physical size of ICs and/or computer systems and the amount of operating noise associated with an IC and/or computer system may also decrease as the number and size of heat sinks and fans is reduced.

Conventionally, one or more switches in an IC are used to selectively switch a voltage rail on or off, thereby selectively powering up or down components connected to the voltage rail. In this manner, the multiple voltage rails may serve to create voltage domains by dividing an IC into voltage islands. In some prior art ICs, more than one voltage rail may be provided, thereby creating multiple voltage islands, each operating at the same or different voltage levels. It is also recognized that one or more voltage rails may operate at a different voltage level than the first power rail. However, the mechanism(s) used to transform the voltage from the level provided on the first power rail (e.g., $V_{dd,\ global}$) to the level provided on a given voltage rail (e.g., $V_{dd,\ int}$), being well known, will not be discussed or illustrated so as not to obscure the present disclosure. Instead, each of the voltage rails discussed and illustrated in the present document are operational to provide the same voltage level (or, due to non-ideal components, nearly the same voltage level) as the first power rail. It will further be appreciated by those of ordinary skill in the art that the added clarity provided by describing the invention with reference to a first (e.g., main) power rail and secondary voltage rails having the same (or similar) voltages is not meant to limit or constrain the invention to only two such rails or to rails with the same (or similar) voltages.

In conventional circuits, transistors may be used to implement the one or more switches that power up a given secondary voltage rail. For instance, FIG. 1 illustrates a prior art example of a circuit 100 having a first power rail 102, a secondary voltage rail 104, and a plurality of switches 105. As illustrated, the plurality of switches 105 includes a plurality of PMOS transistors 106-110 and a plurality of buffers 116-120. It is recognized that each of the PMOS transistors 106-110 is generally of a given size (i.e., have a particular gate width) and resistance to adequately charge the secondary voltage rail 104 (i.e., the PMOS transistors are designed and/or chosen to handle the necessary current drawn from the first power rail 102 and to transfer the voltage from the first power rail 102 to the secondary voltage rail 104. In one embodiment, each of the PMOS transistors 106-110 are identical. In other embodiments, each of the PMOS transistors 106-110 are of a similar size and have a similar resistance.

Although only three PMOS transistors 106-110 are illustrated, it is recognized that additional PMOS transistors may be added. Additionally, it is further recognized that other types of transistors (e.g., NMOS transistors) can be used with little alteration to the overall circuit design. As configured, each PMOS transistor 106-110 has its source terminal coupled to the first power rail 102 and its drain terminal coupled to the secondary voltage rail 104 while each gate terminal is coupled to receive a sleep signal 112. The state of the sleep signal 112 determines whether each of the PMOS transistors 106-110 is conducting (i.e., acting as a closed switch) or not conducting (i.e., acting as an open switch). The sleep signal 112 may be generated by any suitable device located on or off the IC. In one embodiment, a suitable state machine is used to enable or disable the sleep signal and is responsive to a determination that a specific voltage island is required to perform a given task. In the event a given voltage island is not required to work or perform a task, the state machine enables the sleep signal (i.e., it puts the voltage island to sleep). In the event a given voltage island is required to work, the state machine disables the sleep signal (i.e., it wakes up or powers up the island).

In the prior art example of FIG. 1, the gate terminals of each of the PMOS transistors 106-110 are coupled in a daisy chain configuration 114 having buffers 116-120 delaying each PMOS transistor's receipt of the sleep signal 112 by a predetermined interval of time. As recognized, the predetermined interval of time is determined by the delay created by each of the buffers 116-120. In one embodiment, each buffer 116-120 includes two logical inverter circuits (e.g., logical inverter circuits 122, 124 of buffer 116) that add an identifiable delay. Using this configuration, PMOS transistors 106-110 may be serially turned on or off. One having ordinary skill in the art will recognize that serially turning on each PMOS transistor 106-110 avoids pitfalls of similar architectures that do not delay the switching of each PMOS transistor. Such prior art systems incorporating multiple transistors without a delay are essentially equivalent to one large switch or transistor. When switched closed, the large transistor turns on strongly, thereby providing a large, instantaneous source to drain current (i.e., current draw from the first power rail 102) and noise (i.e., voltage fluctuations and IR drops) on the first power rail 102. Since the amount of current drawn from the first power rail is proportional to the size of the PMOS transistor, it is beneficial to serially turn on each PMOS transistor 106-110 at a slightly different time as determined by buffers 116-120. In this manner, the current draw is distributed over time to reduce the noise on the first power rail 102. Therefore, because PMOS transistor 106 is the first in the daisy chain configuration 114, buffer 116 is optional.

Because PMOS transistors 106-110 are used in the prior art example of FIG. 1, a sleep signal 112 representing a logical 0 acts to "close the switch" and power up the secondary voltage rail 104. Similarly, a sleep signal 112 representing a logical 1 acts to "open the switch" and disconnect the secondary voltage rail 104 from the first voltage rail 102 allowing the voltage on the secondary voltage rail 104 to float. One having ordinary skill in the art will recognize that a logical 1 ideally matches the voltage level of the first power rail (e.g., $V_{dd, global}$) and that a logical 0 ideally matches 0 V.

While the prior art system of FIG. 1 operates to power up the secondary voltage rail 104 to the voltage level of the first power rail 102, this technique still draws unnecessarily large source to drain current from the first power rail 102, which leads to noise on the first power rail 102. The large current draw may also cause possible electromigration ("EM") violations due to the relative size of the PMOS transistors 106-110. As known in the art, EM violations result when the current levels in a physical electronic connection are increased to the point where the connection physically breaks down and possibly burns. EM violations may occur from, for example, surpassing a maximum DC current, a maximum peak AC current, a maximum RMS AC current, etc.

Another prior art system (not illustrated) incorporates the general layout of FIG. 1 without buffers 116-120 but varies the source to gate voltage of the transistors over time by altering the sleep signal 112. In effect, this solution weakly turns on the common gate of PMOS transistors 106-110 and then, after some predetermined delay, fully turns on PMOS transistors 106-110. While this helps reduce the instantaneous current draw and thus reduces the amount of noise on the first power rail 102, the implementation of a varied sleep signal and the determination of the time delay are the result of complex circuit, load and device analysis performed during IC design. Moreover, because there is no feedback from the secondary voltage rail regarding its relative charge during the power up sequence (i.e., the control is considered an open loop control), the delay and voltage variation is programmed using the assumption that the secondary voltage rail is fully discharged. Because the secondary voltage rail is not always fully discharged when a power up sequence is required, this preprogrammed (e.g., "hard") delay and voltage variation of the sleep signal may not be the most efficient way of powering up the secondary voltage rail 104.

A third prior art solution (not illustrated) is similar to FIG. 1 and is the equivalent of turning on a small part of the plurality of switches 105 initially and then, after some predetermined delay, turning on the remainder of the plurality of switches 105. This solution may be implemented using the general configuration of FIG. 1 but by replacing, for example, the first PMOS transistor 106 with a smaller PMOS transistor having a smaller gate width. The substituted smaller PMOS transistor operates to allow only a minimal amount of current draw (due to its relative size) before the remaining PMOS transistors 108-110 are switched closed. While this third system helps reduce noise on the first power rail 102, the relative size of the smaller PMOS transistor(s) is design and implementation specific. More importantly, the delay is predetermined (i.e., "hard" and inflexible). Similar to the second system presented above, it fails to consider the relative charge on the secondary voltage rail 104 during power up and, thus, is also an open loop control system. The third system is also similar to the second system above as it requires complex circuit, load and device analysis performed during IC design to determine a suitable delay.

While the prior art illustrates how to charge a secondary voltage rail, it does so in an inefficient manner that may lead to large amounts of instantaneous current draw from the first power rail, large noise (e.g., large IR drops) on the first power rail, and possible EM violations throughout the circuit. Accordingly, a need exists to limit these effects when powering up a secondary voltage rail. A further need exists for powering up a secondary voltage rail without using open loop controlled sleep signals having voltage variations over time. A further need exists for powering up a secondary voltage rail with regard to the current charge present on the secondary voltage rail. A further need exists for powering up a secondary voltage rail without regard to the particular circuit design or implementation.

BRIEF DESCRIPTION OF THE DRAWINGS

The invention will be more readily understood in view of the following description when accompanied by the figures below wherein like reference numerals represent like elements.

FIGS. 5-6 are block diagrams illustrating examples of the automatic voltage level detector circuit of FIGS. 2-3 in accordance with one embodiment of the present disclosure;

DETAILED DESCRIPTION

Figure 1:
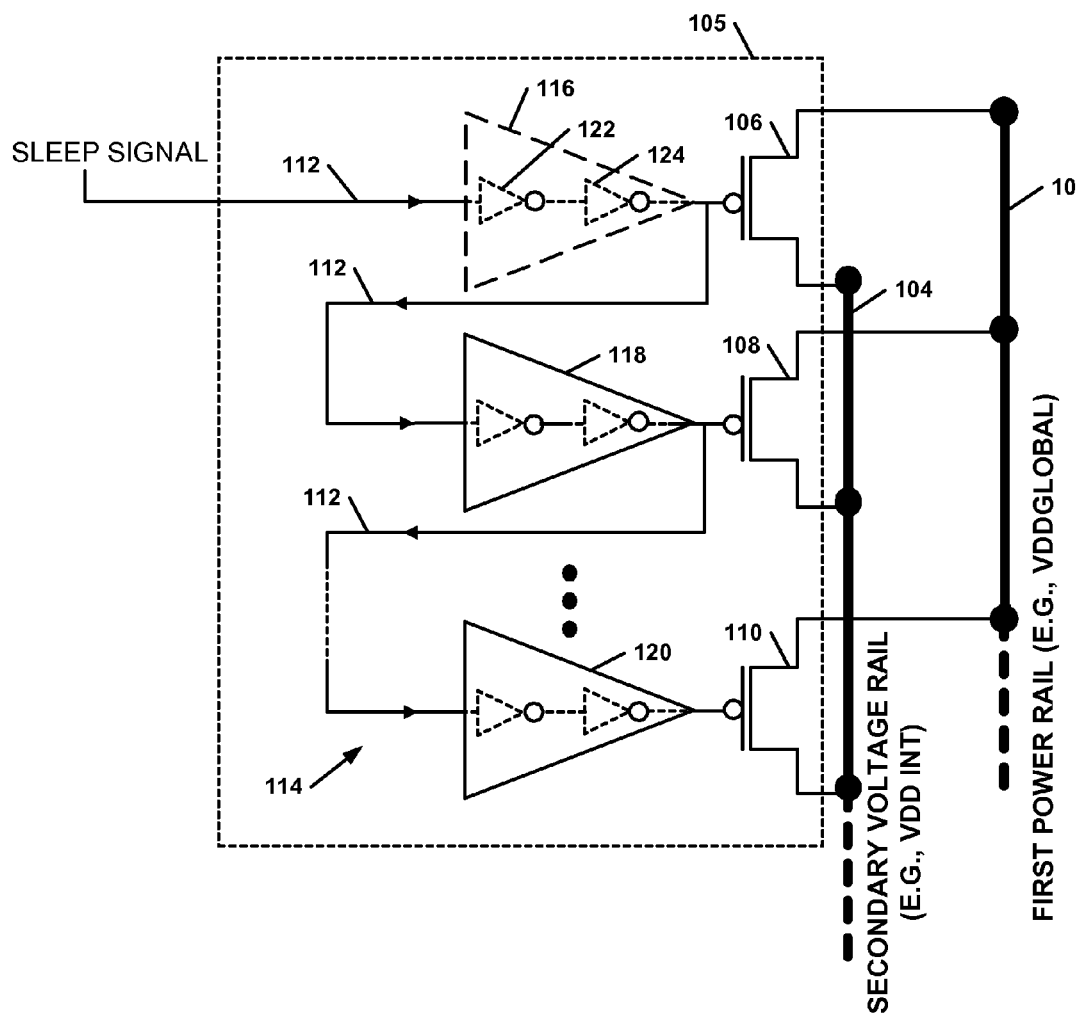
FIG. 1 is a block diagram illustrating a prior art example of a circuit having a first power rail, a secondary voltage rail, and a plurality of switches for selectively charging the secondary voltage rail.

Generally, the present description provides a method and apparatus for selectively switching and charging a secondary voltage rail by detecting a voltage level on the secondary voltage level and selectively charging the partially charged secondary voltage rail based on an initial power control indicator and the detected voltage level. When the initial power control indicator represents a power up command (e.g., a command indicating to power up of the secondary voltage rail) and when the detected voltage level reaches or surpasses a predetermined voltage level, at least one main power gate switch is closed thereby charging the secondary voltage rail. When either the initial power control indicator does not represent the power up command or when the detected voltage level is less than the predetermined voltage level, the at least one main power gate switch remains open thereby not charging the secondary voltage rail.

Prior thereto, the secondary voltage rail is partially charged as a result of at least one soft start power gate switch having selectively and partially charged the secondary voltage rail based on the initial power control indicator. When the initial power control indicator represents an initial power up command, the at least one soft start power gate switch may begin to charge the secondary voltage rail so that the predetermined voltage level is obtained. The secondary voltage rail may have been partially charged as a result of it not being fully discharged prior to receipt of the initial power control indicator indicating an initial power up command.

In one embodiment, each of the at least one soft start power gate switch is a soft start PMOS transistor and each of the at least one main power gate switch is a main PMOS transistor where the gate width of each soft start PMOS transistor is smaller than the gate width of each main PMOS transistor. In another embodiment, each of the at least one soft start power gate switches and main power gate switches are daisy chained together, respectively, so that they are serially opened and closed based on the initial power control indicator and main power control indicator, respectively.

In one embodiment, the voltage level detected on the secondary voltage rail is detected using at least one automatic voltage level detection circuit. The automatic voltage level detection circuit is coupled to the secondary voltage rail and receives the initial power control indicator; the automatic voltage level detection circuit generates the main power control indicator based on the detected voltage level and the initial power control indicator. In one embodiment, the automatic voltage level detection circuit includes a diode connected PMOS transistor having its gate terminal coupled to its drain terminal to "detect" the voltage on the secondary voltage rail. When the voltage level on the secondary voltage rail reaches or surpasses a predetermined voltage level and when the initial power control indicator represents an initial power up command, the main power control indicator represents a main power up command. In one embodiment, the predetermined voltage level is selected to reduce the susceptibility of noise along the first power rail when charging the secondary voltage rail and/or the susceptibility of one or more electromigration violations in the circuit when charging the secondary voltage rail.

In one embodiment, the apparatus includes one or more automatic voltage level detection circuits where each automatic voltage level detection circuit generates an intermediate power control indicator. The apparatus uses a confirmation circuit to generate the main power control indicator based on each of the intermediate power control indicators such that the main power control indicator represents a main power up command only when each of the intermediate power control indicators are in a state indicating that its corresponding automatic voltage level detection circuit has received an initial power up command and has also detected the predetermined voltage level on the secondary voltage rail.

The present disclosure can be more fully described with reference to FIGS. 1-12. In the following detailed description, numerous specific details are set forth in order to provide a thorough understanding of the present disclosure. It will be apparent to one of ordinary skill in the art, however, that these specific details need not be used to practice the present embodiments of the disclosure. In other instances, well-known structures, interfaces, and processes have not been shown or have not been shown in detail in order not to unnecessarily obscure the present disclosure.

Figure 2:
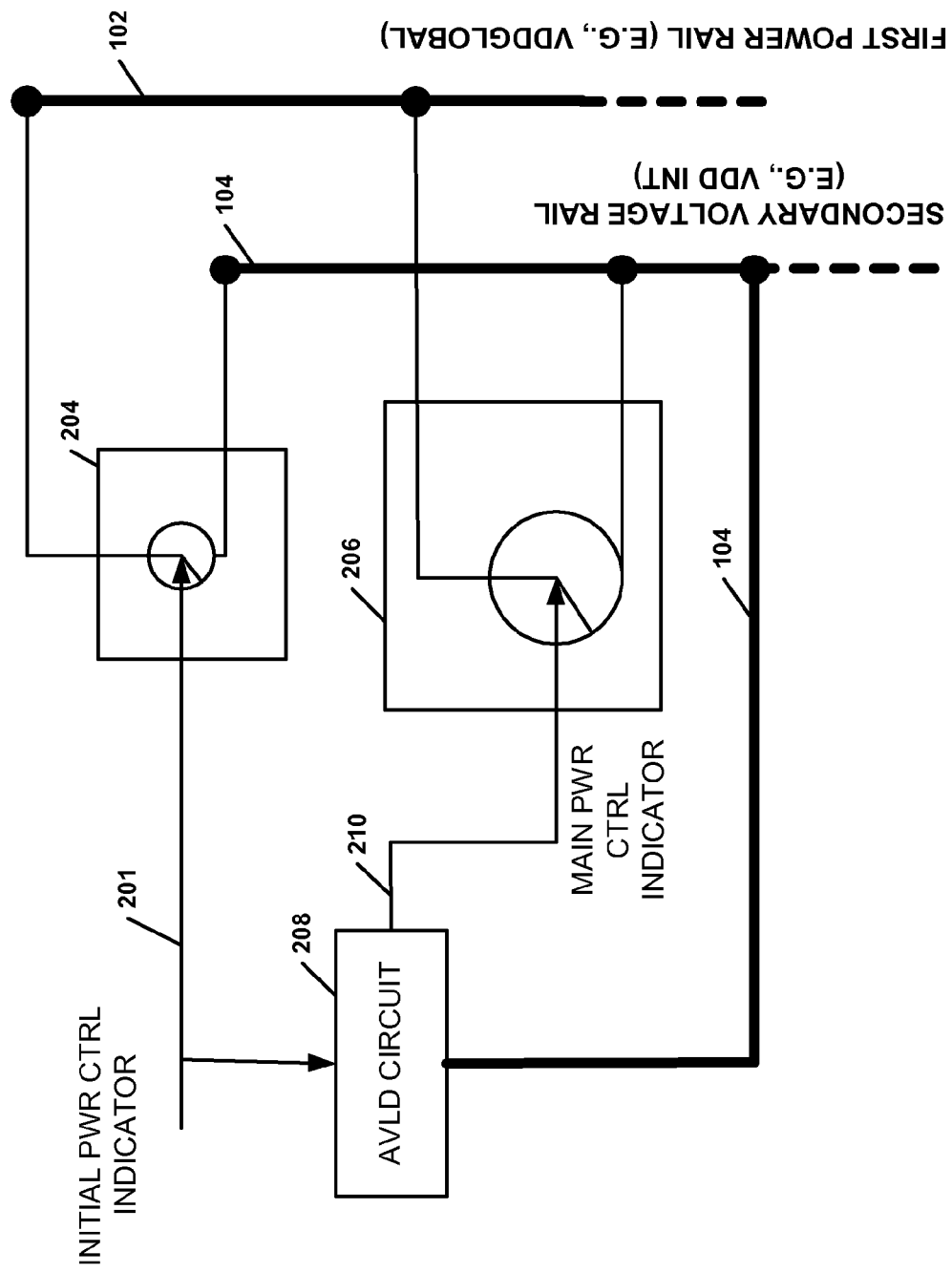
FIG. 2 is a block diagram illustrating one example of a circuit having a first power rail, a secondary voltage rail, at least one main power gate switch, at least one soft start power gate switch, and an automatic voltage level detection circuit for selectively charging the secondary voltage rail in accordance with one embodiment of the present disclosure.

FIG. 2 is a block diagram illustrating one example of a circuit 200 having a first power rail 102, a secondary voltage rail 104, at least one main power gate switch 206, at least one soft start power gate switch 204, and an automatic voltage level detection circuit 208 for selectively charging the secondary voltage rail 104 in accordance with one embodiment of the present disclosure. As illustrated, the at least one soft start power gate 204 is coupled to the first power rail 102 and the secondary voltage rail 104. Based on the initial power control indicator 201, the at least one soft start power gate 204 opens or closes its switch(es) and thereby selectively and partially charging the secondary voltage rail 104. The initial power control indicator 201 may be a signal such as sleep signal 112 of FIG. 1 or any other suitable indicator, flag or command that controls the opening and closing of the at least one soft start power gate switch 205. The at least one main power gate 206 is also coupled to the first power rail 102 and the secondary voltage rail 104. Based on a main power control indicator 210, the at least one main power gate 206 opens or closes its switch(es) and thereby selectively charges the secondary voltage rail 104 to a more fully charged state or to a fully charged state. Like the initial power control indicator 201, the main power control indicator 210 may be any suitable signal, flag or command that controls the opening and closing of the at least one main power gate switch 204. The automatic voltage level detector ("AVLD") circuit 208 is coupled to receive the initial power control indicator 201 and to detect the voltage level of the secondary voltage rail 104. Based on the initial power control indicator 201 and the secondary voltage rail, the AVLD circuit 208 generates the main power control indicator 210.

When the initial power control indicator 201 is in a first state, the at least one soft start power gate switch 204 is open. However, in another state, the at least one soft start power gate switch 204 is closed. The state of the initial power control indicator 201 that closes the at least one soft start power gate switch 204 represents an initial power up command as it initiates initial power up of the secondary voltage line 104. Similarly, when the main power control indicator 210 is in a first state, the at least one main power gate switch 206 is open. However, in another state, the at least one main power gate switch 206 is closed. The state of the main power control indicator 210 that closes the at least one main power gate switch 206 represents a main power up command as it initiates the main power up of the secondary voltage line 104.

The AVLD circuit 208 monitors the voltage level of the secondary voltage rail 104 and, based on the state of the initial power control indicator 201, generates the main power control indicator 210 in one of the two states described above. When the initial power control indicator 201 is in the first state (such that the at least one soft start power gate switch 204 opens or remains open), the AVLD circuit 208 generates the main power control indicator 210 in a corresponding first state (where the at least one main power gate switch 206 opens or remains open). When the AVLD circuit 208 receives an initial power up command, the main power control indicator 210 remains in the first state until a predetermined voltage level has been detected or surpassed on the secondary voltage rail 104. Once the predetermined voltage level has been detected, the AVLD circuit 208 generates the main power up command and closes the at least one main power gate switch 206.

The at least one soft start power gate 204 slowly charges the secondary voltage rail 104 so as to begin the power up process with minimal current draw from the first power rail 102. By minimizing the current draw from the first power rail 102, the noise or IR drop along the first power rail 102 is reduced. As the secondary voltage rail 104 begins to charge, the voltage level of the secondary voltage rail 104 rises. Once the secondary voltage rail 104 voltage level is equal to or greater than the predetermined voltage level, the more powerful main power gate switch(s) 206 turns on and continues charging the partially charged secondary voltage rail 104. If the secondary voltage rail 104 is not fully discharged when an initial power up command is received and if the voltage rail 104 has a voltage level at or greater than the predetermined voltage level, the at least one main power gate switch 206 may be immediately closed to more quickly charge the secondary voltage rail 104. That is, one does not need to wait a predetermined amount of time before the main switches are closed as discussed above with respect to the prior art. One having ordinary skill in the art will recognize that the predetermined voltage level may be any suitable voltage level and may be selected to reduce the susceptibility of noise along the first power rail 102 and/or the susceptibility of one or more EM violations when charging the secondary voltage rail 104. In one embodiment, the voltage level of the first power rail 102 is 1.2 V and the predetermined voltage level is at or around 1.0 V (i.e., equal to 0.5 V plus the threshold voltage of a PMOS transistor). In another embodiment, the predetermined voltage level is as close as possible to the voltage level of the first power rail 102 to limit current draw attributable to the at least one main power gate switch 206. However, this value may be adjusted to meet the needs of the device in which circuit 200 operates.

By slowly or softly starting the charging process and partially charging the secondary voltage rail 104 and only then closing the at least one main power gate switch 206, the larger switch(s) of the at least one main power gate switch 206 can operate without causing an adverse increase in current draw. Consequently, the noise along the first power rail 102 is decreased and the possibilities of EM violations in the circuit 200 or any other connections affected by the circuit 200 are minimized. Additionally, because the AVLD circuit 208 generates the main power control indicator 210 based on the initial power control indicator 201 and detected voltage level of the secondary voltage rail 104 (i.e., through feedback) the circuit has a closed loop control and does not rely on predetermined or hard delays before the secondary voltage rail 104 is fully charged.

The at least one soft start power gate switch 204 and the at least one main power gate switch 206 may be any suitable switching devices such as, but not limited to, semiconductor transistors or any suitable combination of discrete components that opens or closes based on a control signal such as the initial power control indicator 201 and the main control indicator 210. The at least one main power gate switch 206 must, however, be capable of allowing larger amounts of current draw from the first power rail 102 than the at least one soft start power gate switch 204. The at least one soft start power gate switch 204 must draw less current than the at least one main power gate 206 to ensure the "soft start" of the powering up process, thereby avoiding noise and EM violations.

The AVLD circuit 208 may be any suitable device or devices that detects the voltage level of the secondary voltage rail 104 and is capable of closing the at least one main power gate switch 206 when the voltage level of the secondary voltage rail 104 is greater than or equal to a predetermined level and when the initial power control indicator 201 is in the proper state. The AVLD circuit 208 may be any combination of semiconductor transistors or any other suitable combination of discrete components.

Figure 3:
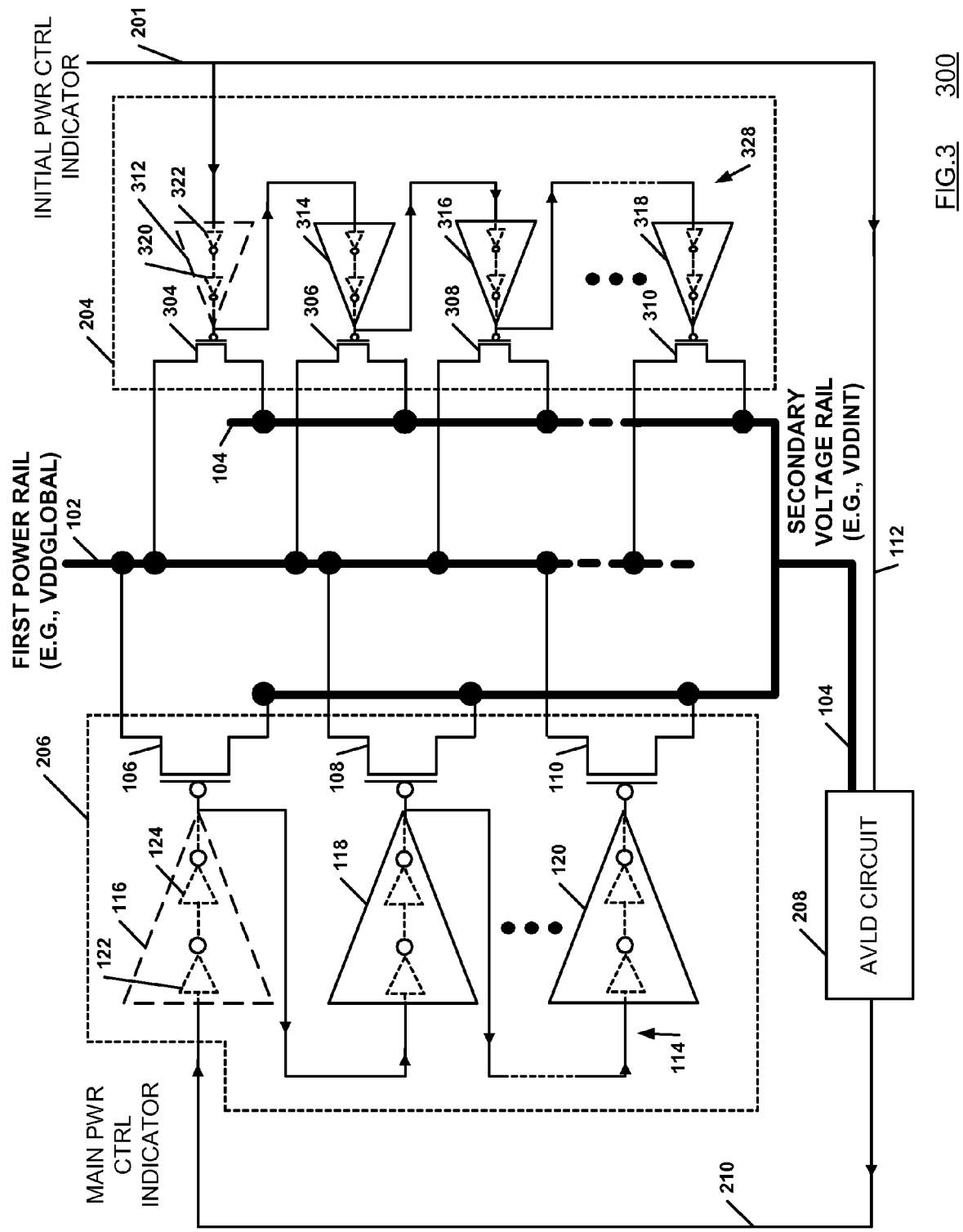
FIG. 3 is a block diagram illustrating a more detailed example of the circuit of FIG. 2 wherein the at least one main power gate switch includes a plurality of main PMOS transistors and a plurality of main buffers and wherein the at least one soft start power gate switch includes a plurality of soft start PMOS transistors and a plurality of soft start buffers.

FIG. 3 is a block diagram 300 illustrating a more detailed example of the circuit of FIG. 2 wherein the at least one main power gate switch 206 includes three switches coupled together in a main daisy chain configuration 114 and wherein the at least one soft start power gate switch 204 includes four switches coupled together in a soft start daisy chain configuration 328. In the illustrated embodiment, the three main power gate switches include three main PMOS transistors 106-110 and three corresponding main buffers 116-120. Similarly, the four soft start power gate switches include four soft start PMOS transistors 304-310 and four corresponding soft start buffers 312-318. However, any number of main PMOS transistors and soft start PMOS transistors may be used. Similarly any number of main buffers or soft start buffers may be incorporated. For example, main buffer 116 and soft start buffer 312 are optional. Other buffers may also be optional. The functionality of the main buffers 116-120 and plurality of main PMOS transistors 106-110 operate in the identical manner as described above with respect to FIG. 1. Hence, when the main power control indicator 210 represents a main power up indicator, the plurality of main PMOS transistors are closed, thereby charging the secondary voltage rail 104. Similarly, the plurality of soft start PMOS transistors 304-310, soft start buffers 312-318 (and corresponding inverters such as inverters 320-322) operate in a corresponding fashion. That is, the plurality of soft start PMOS transistors 304-310 close their switches and charge the secondary voltage rail 104 when the initial power control indicator 201 represents an initial power up command.

Collectively, the main PMOS transistors 106-110 are capable of allowing more current draw from the first power rail 102 than the soft start PMOS transistors 304-310. This ensures the "soft start" of the powering up process. In one embodiment, each of the soft start PMOS transistors 212-222 are of a smaller size (i.e., gate width) and of a larger effective resistance than each of the main PMOS transistors 106-110 thereby limiting the amount of current draw possible when the soft start PMOS transistors are conducting. Although the preferred implementation uses PMOS devices, it is equally recognized that other types of devices (e.g., NMOS transistors) may be substituted in the place of the main and soft start PMOS transistors.

Figure 4:
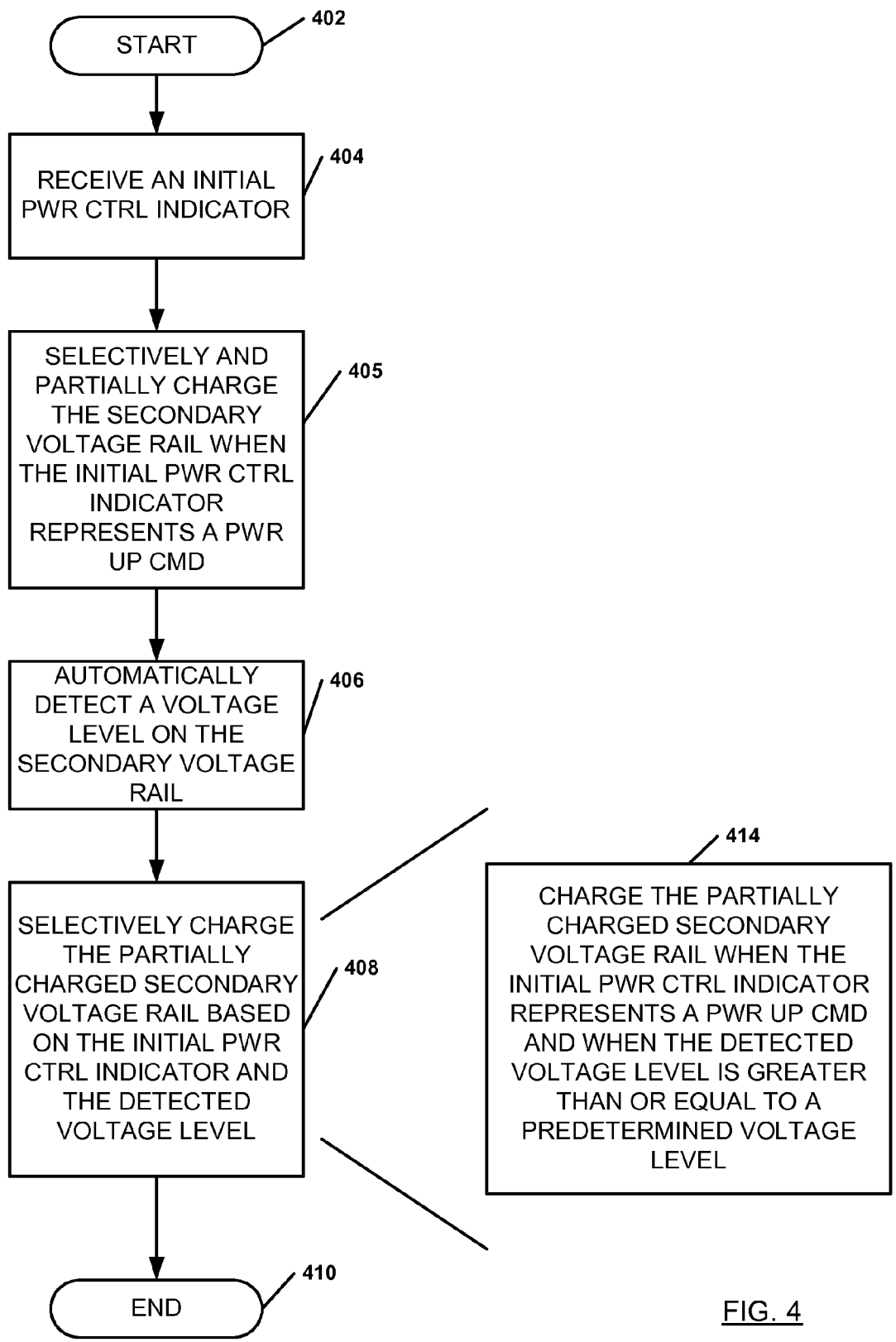
FIG. 4 is a flow chart illustrating one example of a method for selectively charging a secondary voltage rail in accordance with one embodiment of the present disclosure.

FIG. 4 is a flow chart illustrating one example of a method for selectively charging a secondary voltage rail in accordance with one embodiment of the present disclosure. The method begins in block 402 where, for example, an initial power control indicator is generated. The method continues in block where an initial power control indicator is received. In one embodiment, this corresponds to using AVLD circuit 208 to receive the initial power control indicator 201 as explained with respect to FIG. 3. The method continues in block 405 where the secondary voltage rail is selectively and partially charged when the initial power control indicator represents a power up command. This may, for example, correspond to opening the at least one main power gate switch 204 as explained above. It is noted that the secondary voltage rail may already have a charge associate therewith if not fully discharged prior to receipt of the power up command. Thereafter, the method continues in block 406 where a voltage level is automatically detected on the secondary voltage rail. As explained above, the AVLD circuit 208 of FIGS. 2-3 automatically detects the voltage on secondary voltage rail 104.

The method then continues in block 408 where the partially charged secondary voltage rail is selectively charged based on the initial power control indicator and the detected voltage level. As explained above with respect to FIGS. 2-3, the AVLD circuit 208 may cause the at least one main power gate switch 206 to open or close based on the state of the initial power control indicator 201 and the detected voltage level on the secondary voltage rail 102. As illustrated, block 408 may include the method of block 414 where the partially charged secondary voltage rail is charged when the initial power control indicator represents a power up command and when the detected voltage level is greater than or equal to a predetermined voltage level. Thereafter, the method concludes in block 410 where, for example, components coupled to the secondary voltage rail 104 may begin to work or perform a desired task now that the voltage island is charged.

FIGS. 5-6 are block diagrams illustrating examples of AVLD circuit 208 of FIGS. 2-3 in accordance with one embodiment of the present disclosure. FIG. 5 illustrates a first example 500 of the AVLD circuit 208. As illustrated, AVLD circuit 208 is coupled to the secondary voltage rail 104 and is further coupled to receive the initial power control indicator 201. As before, the AVLD circuit 208 generates the main power control indicator 210. Example 500 of AVLD circuit 208 includes a diode connected transistor 502 having its source terminal coupled to the secondary voltage rail 104, its gate terminal coupled to its drain terminal and its drain terminal coupled to a first input of a logical NAND circuit 506. Example 500 of AVLD circuit 208 further includes a logical inverter circuit 504 coupled to receive the initial power control indicator 201 and having an output (an inverted power control indicator 505) coupled to the second input of logical NAND circuit 506. The output of the logical NAND circuit 506 is the generated main power control indicator 210. In one embodiment, the diode connected PMOS transistor 502 is fabricated as a multi-fingered device having two or more gate fingers such that each AVLD circuit 108 remains capable of generating the main power control indicator 210 if at least one of the gate fingers remains operational when other fingers are not functioning (e.g., as a result of being malformed during fabrication).

As one having ordinary skill in the art will recognize, if the initial power control indicator 201 is high (e.g., a logical 1), in this case indicating that the secondary voltage rail 104 should not be charging, the second input of the logical NAND circuit 506 (i.e., the inverted initial power control indicator 505) will be a logical 0. Thus, regardless of the logical value at the first input of logical NAND circuit 506, its output, the main power control indicator 210, will be high (e.g., a logical 1). This is appropriate as the main power control 210 should match the initial power control indicator 201. However, if the initial sleep signal is low (e.g., a logical 0), in this case representative of the initial power up command, the second input to the logical NAND circuit 506 will be a logical 1. Thus, the logical value at the first input of the logical NAND circuit 506 will determine its output. When the initial power control indicator 201 represents the initial power up command, the voltage level of the secondary voltage rail 104 should be increasing in time unless the rail is already fully charged.

The diode connected PMOS transistor 502 will remain off until the voltage level of the secondary voltage rail 104 reaches the threshold voltage of the diode connected PMOS transistor 502. At his point, the diode connected PMOS transistor 502 will begin to conduct causing the voltage at its drain terminal to equal the voltage level of the secondary power rail 104 minus the threshold voltage drop of the diode connect PMOS transistor 502. Initially, the value at the first input of the logical NAND circuit 506 was a logic 0 (i.e., the diode connected PMOS transistor was off). However, when the diode connector PMOS transistor 502 turns on and when logical 1 is presented at the first input, the output of the logical NAND circuit 506 toggles to a logical 0 representing a main power up command. As recognized, if the logical NAND circuit 506 is implemented using MOS devices, a logical 1 is experienced at the first input of the logical NAND circuit 506 when the voltage level at the drain terminal of the diode connector PMOS transistor 502 rises to at least the threshold voltage of the NMOS transistor (not illustrated) internal to the logical NAND circuit 506. This voltage level is the predetermined voltage level.

FIG. 6 illustrates a second example 600 of the AVLD circuit 208 comprising two first example 500-type AVLD circuits 500 (blocks 604 and 606) coupled in series where the output of the first logical NAND gate 506 of block 604 (i.e., the preliminary main power control 607) is coupled to the second logical inverter circuit 504 of block 606. Block 604 is serially coupled with block 606 such that, in the event one of the diode connected PMOS transistors 502 shorts out during operation, example 600 of AVLD circuit 208 will still function with the block 604 or 606 having the operational diode connected PMOS transistor 502. Additionally, each of blocks 604 and 606 further includes a keeper PMOS transistor 602. The source terminal of each keeper PMOS transistor 602 is coupled to the secondary voltage rail 104, the drain terminal of each keeper PMOS transistor 602 is coupled to the respective first input of the logical NAND circuit 506 and the gate terminal of each keeper PMOS transistor 602 is coupled to the output of the logical NAND circuit 506.

As one having ordinary skill in the art will recognize, the keeper PMOS transistors 602 will only turn on when the secondary voltage rail 104 represents a logical 1 and the output of the logical NAND circuit 506 is a logical 0. At this point, each diode connected PMOS transistor 502 has just turned on and caused a logical 0 output of the logical NAND circuit 506. However, the voltage level at the first input of the logical NAND circuit 506 is considered "weak" due to the threshold voltage drop across each diode connected PMOS transistor 502. Accordingly, each keeper PMOS transistor 602 will turn on and generate a stronger logical 1 at the first input of each logical NAND circuit 506 by pulling up the voltage level and equalizing it to the level of the secondary voltage rail 102. By including the keeper PMOS transistor 602, the second example 600 of the AVLD circuit 208 limits the amount of current leakage through the logical NAND circuits 506.

Figure 7:
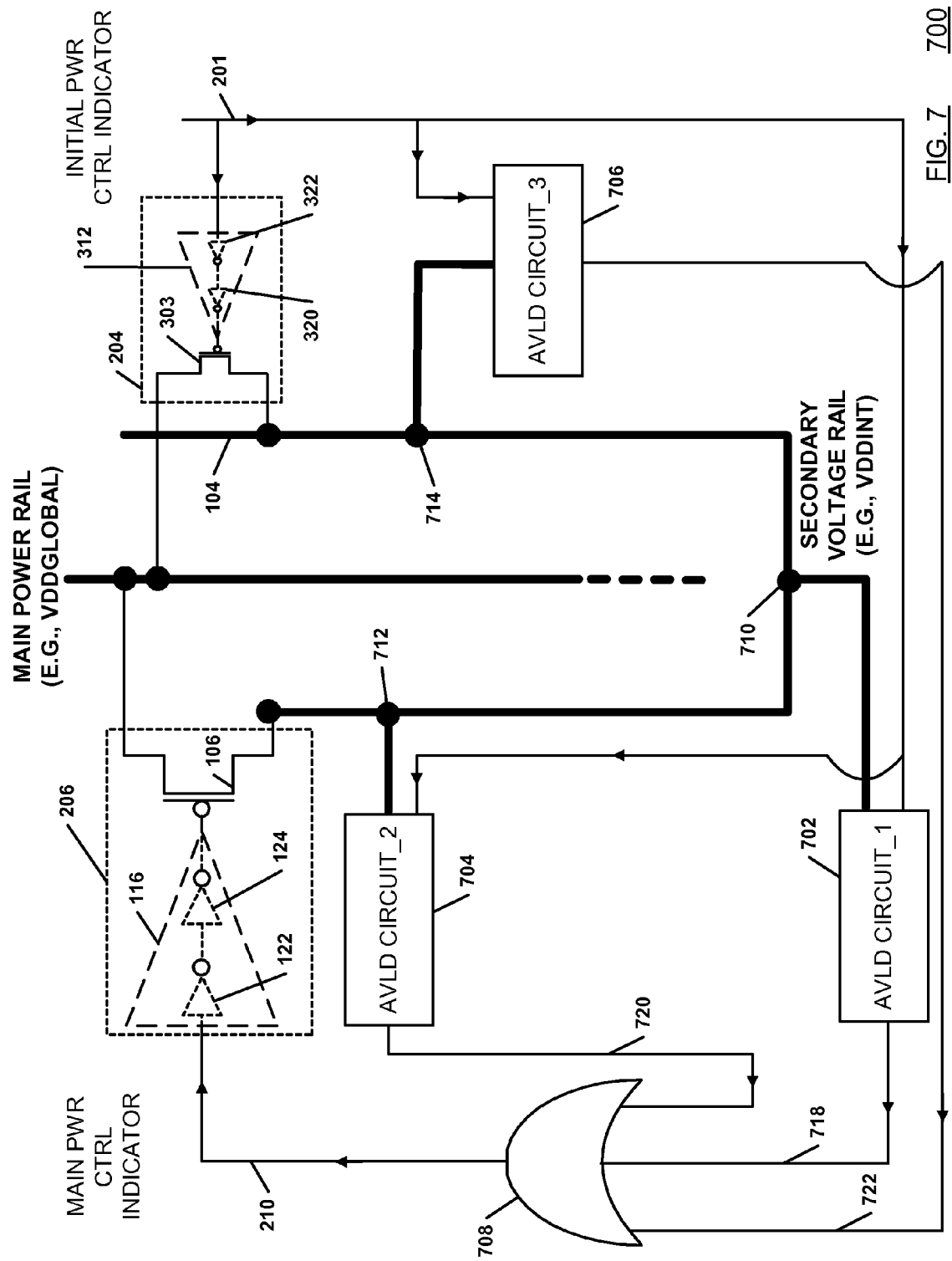
FIG. 7 is a block diagram illustrating another example of a circuit including a first power rail, a secondary voltage rail, at least one main power gate switch, at least one soft start power gate switch, a plurality of automatic voltage level detection circuits, and a confirmation circuit for electively charging the secondary voltage rail in accordance with one embodiment of the present disclosure.

FIG. 7 is a block diagram illustrating another example of a circuit 700 including a first power rail 102, a secondary voltage rail 104, at least one main power gate switch 206, at least one soft start power gate switch 204, a plurality of automatic voltage level detection circuits 702-706 each coupled to the secondary voltage rail 104 at three distinct locations 710-714, and a confirmation circuit 708 for selectively charging the secondary voltage rail in accordance with one embodiment of the present disclosure. Circuit 700 operates in substantially the same manner as the circuits of FIGS. 2-3, however instead of employing a single AVLD circuit 208, circuit 700 employs two or more AVLD circuits 702-706. In the illustration, three AVLD circuits 702-706 are incorporated for purposes of example. Each of the AVLD circuits 702-706 functions identically to the AVLD circuits 208 discussed above with respect to FIGS. 5-6 but generates a corresponding intermediate power control indicators 718-722 from which that main power control indicator 210 is based. Accordingly, each of the intermediate power control indicators 718-722 should roughly follow the initial power control indicator 201 by detecting the voltage level of the secondary voltage rail 104.

Each of the intermediate power control indicators 718-722 are coupled to the inputs of confirmation circuit 708. Confirmation circuit 708 only generates a main power control indicator 210 representing the main power up command (e.g., a logical 0) when each of the intermediate power control indicators 718-722 indicates that its corresponding AVLD circuit 702-706 has received an initial power up command and that the voltage level at the corresponding multiple locations 710-714 along the secondary voltage rail 104 is greater than or equal to the predetermined voltage level. If any of the intermediate power control indicators 718-722 indicate that it has not received an initial power up command or that the voltage level detected at its location is not at or greater than the predetermined level, then the confirmation circuit 708 generates a main power command indicator 210 (e.g., a logical 1) to close the at least one main power gate switch 206. In one example, the confirmation circuit 708 is a logical OR circuit. However, any other suitable device may be substituted therefore.

Figure 8:
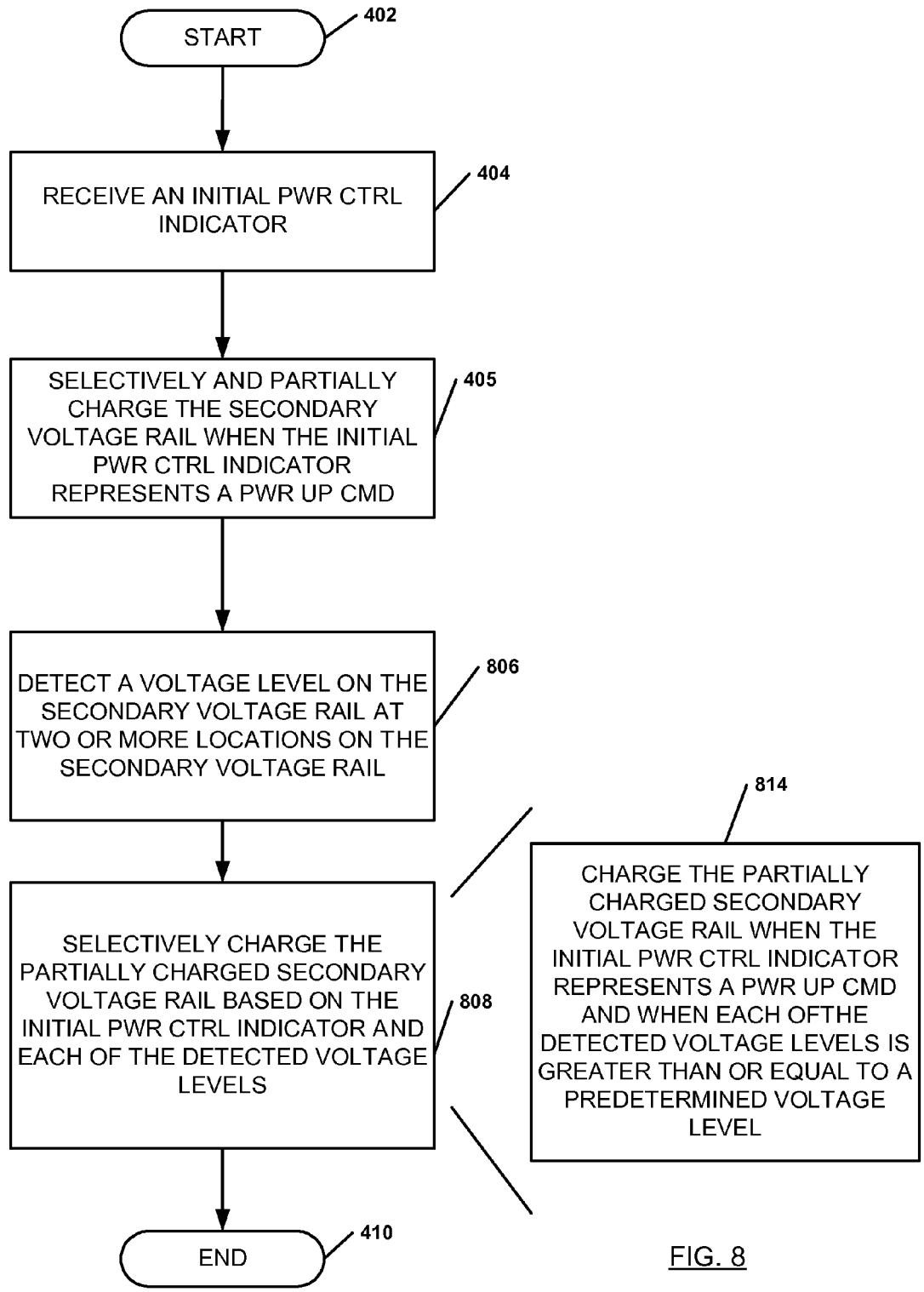
FIG. 8 is a flow chart illustrating another example of a method for selectively charging a secondary voltage rail in accordance with one embodiment of the present disclosure.

FIG. 8 is a flow chart illustrating another example of a method for selectively charging a secondary voltage rail in accordance with one embodiment of the present disclosure. The method begins with blocks 402-405 and continues by detecting a voltage level on the secondary voltage rail at two or more locations on the secondary voltage rail in accordance with block 806. In one embodiment, this is performed by the one or more AVLD circuits 602-608 that detect the voltage at locations 610-614. The method then continues with block 808 where the partially charged secondary voltage rail is selectively charged based on the initial power control indicator and each of the detected voltage levels. In one embodiment, block 808 may be implemented using confirmation circuit 608 to generate the main power control indicator 210 as explained above to selectively charge the rail 104. The method may further include block 814 where the partially charge secondary voltage rail is charged when the initial power control indicator represents a power up command and when each of the detected voltage levels is greater than or equal to a predetermined voltage level. In one embodiment, block 814 is implemented using the computation block 608 and the one or more AVLD circuits 602-606 as discussed above.

Figure 9:
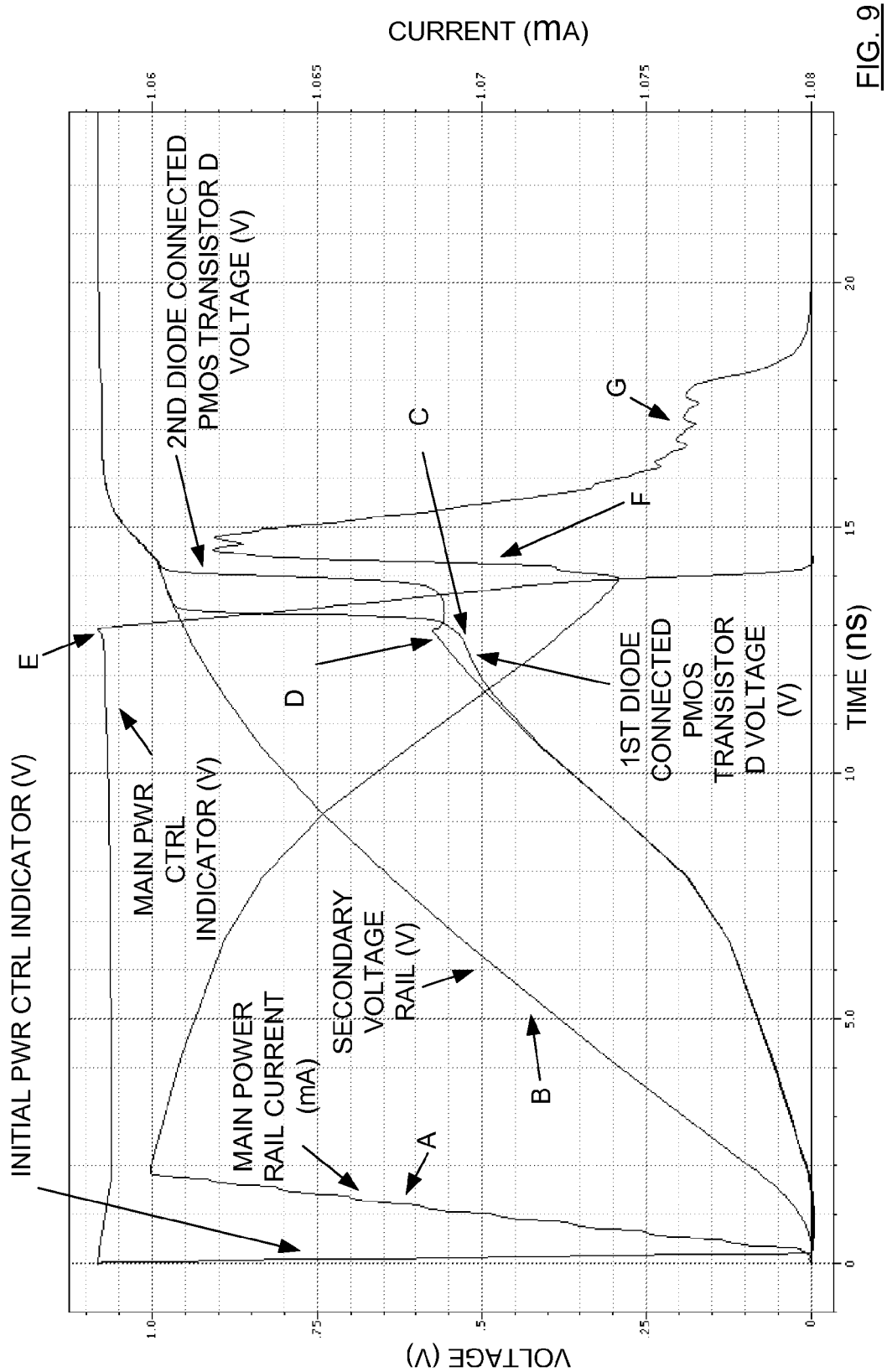
FIG. 9 is a plot illustrating various voltage and current values over time as measured at various nodes in an exemplary circuit of the present disclosure thereby illustrating the performance of the circuit.

FIG. 9 is a plot illustrating various voltage and current values over time as measured at various nodes in an exemplary circuit (e.g., FIG. 2) of the present disclosure incorporating the AVLD circuit 208 of FIG. 6 thereby illustrating the performance of the circuit. The plot illustrates the characteristics of an exemplary circuit from the point when the initial power control indicator 201 is toggled to represent the initial power up command. In this embodiment, the initial power control indicator 201 represents the initial power up command when in a logical 0 state. As illustrated, this occurs at about 0.25 ns. As the initial power control indicator goes low, the at least one soft start switch 204 is closed and there is a gradual current increase as each of the soft start switches is turned on. This is indicated by reference point A. At the same time, the secondary voltage rail 104 is slowly being charged as indicated by reference point B.

Noticeably, as the secondary voltage rail 104 is charged, the voltage level seen at the drain terminal of the diode connect PMOS transistors 502 of the AVLD circuit 208 is also slowly increasing. At about reference point C, the first diode connected PMOS transistor 502 of block 604 has the equivalent of a logic 1 at its drain terminal and the preliminary main power control indicator 607 becomes a logic 0. At about reference point D, the second diode connected PMOS transistor 502 of block 606 has the equivalent of a logic 1 at its drain terminal and the main power control indicator 210 is a logic 0 as indicated by reference point E and the at least one main power gate switch 206 is closed to continue charging the secondary voltage rail 104. As the at least one main power gate switch 206 is closed, the current draw begins to increase as illustrated at point F. However, as seen by reference point G, the current draw begins to taper even if several main power gate switches are used. The current draw is minimized because the secondary voltage rail 104 is or is almost fully charged at this point.

Figure 10:
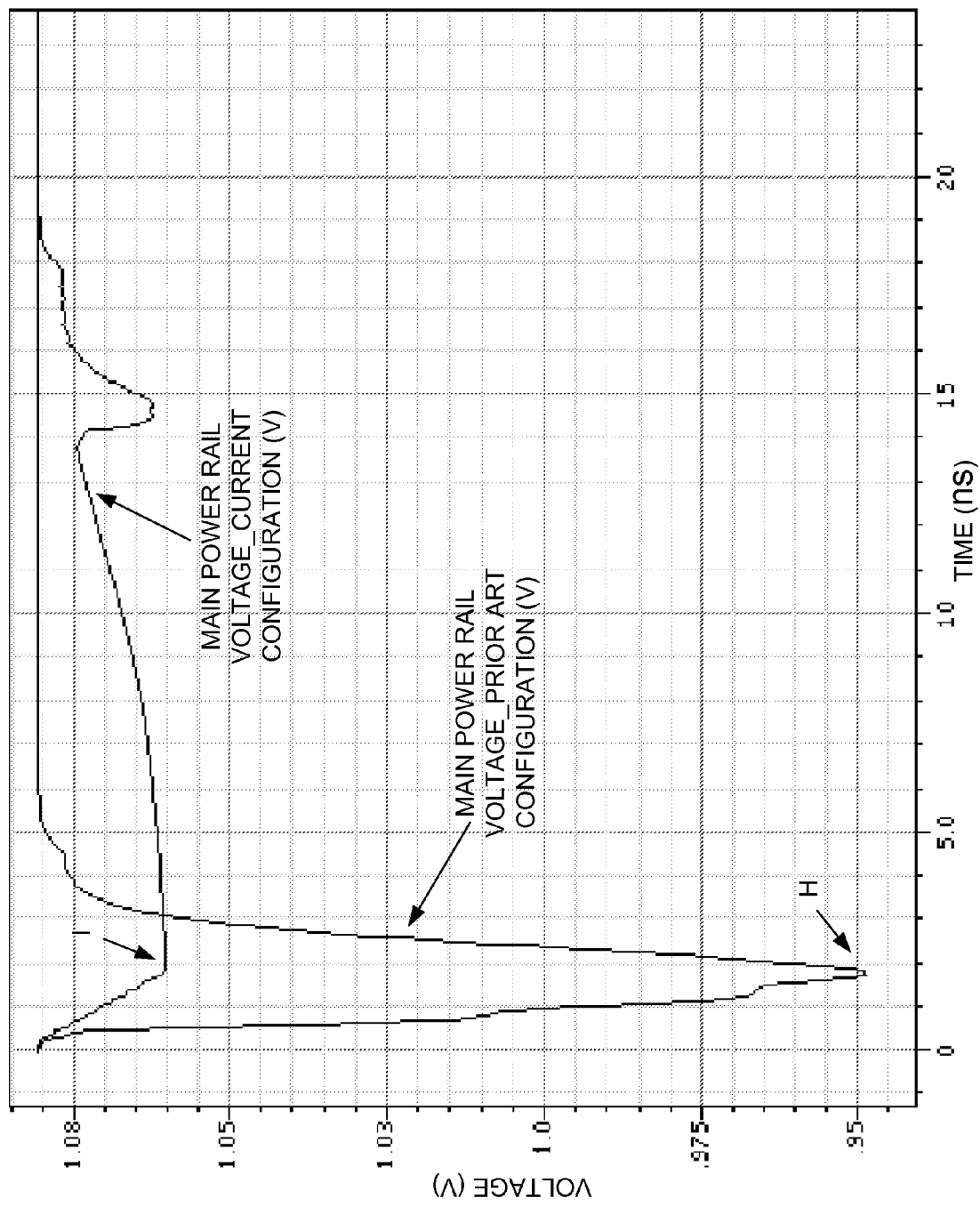
FIG. 10 is a plot illustrating the voltage level of the first power rail over time of both an exemplary circuit of the present disclosure (e.g., FIG. 3) and an exemplary circuit of the prior art (e.g., FIG. 1)

FIG. 10 is a plot illustrating the voltage level of the first power rail over time of both an exemplary circuit (e.g., FIG. 2) of the present disclosure and an exemplary circuit of the prior art (e.g., FIG. 1). As indicated, the plot illustrates the voltage level along the first power rail 102 as during a power up cycle (e.g., the cycle illustrated in FIG. 9). The prior art circuit of FIG. 1 has a performance characterized by the trace having a large IR drop at reference point H. This is a statistical result of not using the at least one soft start switch 204. The large voltage drop results because there is a large amount of current drawn from the main voltage rail 102 when the PMOS transistors 106-110 turn on. However, the circuit of FIG. 2 has the performance characterized by the tracing having a much smaller IR drop at reference point I. As illustrated, the voltage drop is limited and therefore, among other things, causes less problems to components in the IC that rely on the main voltage rail 102.

Figure 11:
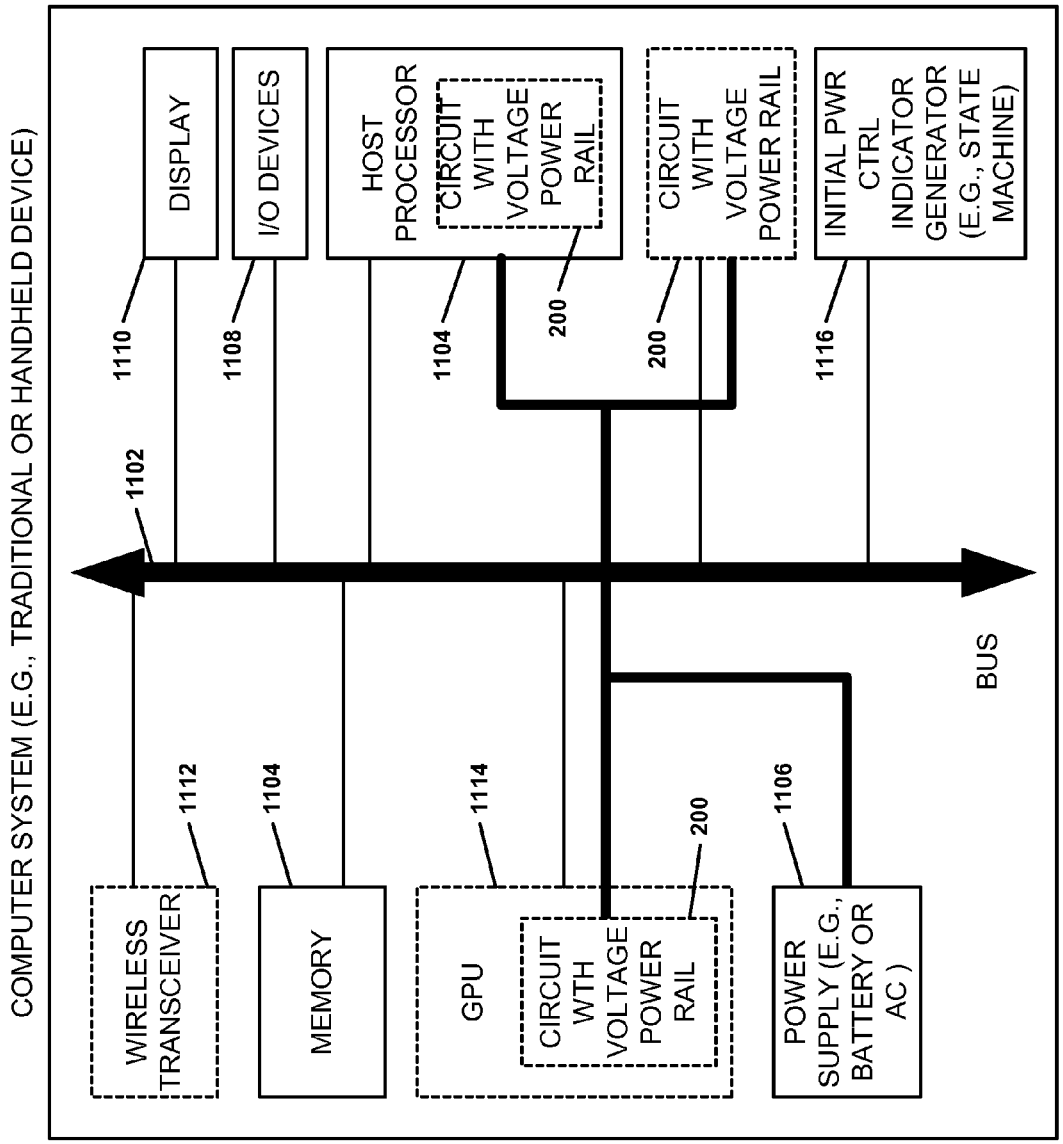
FIG. 11 is a block diagram illustrating a computer system in which the circuit of FIGS. 2-3 or 7 may be incorporated.

FIG. 11 is a block diagram illustrating a computer system 1100 in which the circuit of FIGS. 2-3 or 7 may be incorporated. As used herein, computer system 1100 may be any suitable device that processes digital data including but not limited to personal computers, handheld devices, workstations, etc. As illustrated, the computer system 1100 may comprises a bus 1102 such as any suitable bus or link that is operable to convey information and data to and from the components of system 1100. Computer system 1100 further includes a display 1110, one or more input/output devices 1108, a host processor 1104, an initial power control indicator generator 1116, a power supply 1106 and memory 1104. In one embodiment, computer system 1100 further includes a wireless transceiver 1112 and a multimedia or graphics processor (e.g., GPU) 1114.

The display 1110 may by any suitable display capable of visually reproducing information such as, but not limited to an LCD or a CRT. Display 1110 may be part of the physical system or may be externally coupled thereto. Input/output devices 1108 may be any suitable device capable of capturing commands input from a user and/or capable of providing a user interface for capturing commands and providing feedback to the user (via, for example, audible or visual indicators). Input/output devices 1108 may include, for example, a keyboard, a touchpad, or a mouse. A host processor 1104 may be any suitable processor or processors such as, but not limited to, one or more of: a CPU, a broadband processor, a microprocessor and a controller. Memory 1104 may be any suitable memory or memories such as, but not limited to, flash memory, system memory, frame buffer memory, one or more mass storage devices, networked memory or other remote memory. Accordingly, memory 1104 may be volatile or non-volatile memory. Accordingly, memory 1104 may be implemented, for example, using one or more of the following technologies: RAM, DRAM, SRAM, PROM, EEPROM, CD-ROM, ROM, etc. Wireless transceiver 1112 may be any suitable transmitter/receiver capable of uploading and downloading broadcast signals from a service provider. In one embodiment, the GPU is an Imageon™-type media processor as sold by ATI Technologies Inc. located at 1 Commerce Valley Drive; East Markham, Ontario; Canada L3T 7X6.

As illustrated, the system 1100 also includes circuit 200 associated with one of the GPU 1114 or host processor 1104. In another embodiment, circuit 200 may be a stand alone circuit such as an integrated circuit not directly associated with or integrated with the host processor 1104 or the GPU 1114. Accordingly, circuit 200 may be part of an integrated circuit, an IC package, an ASIC, etc.

As illustrated, each of the components is generally coupled to the bus 1102 to enable suitable communication between the computer system 1100 devices as understood in the art. However, the power supply 1106, which may be a battery or link to an AC power source, is coupled to provide power to at least the one or more circuits 200. More specifically, the power supply 1106 is coupled to the main power supply rail 102 of each of the one or more circuits 200. Thus, when the initial power control indicator generator 1116, which may correspond to any suitable state machine or other device as explained above, generates an initial power control indicator to the ICs, the secondary voltage rail 104 associated with each of the circuits 200 may selectively be charged as described above. As described above, the initial power control indicator generator 1116 may, in one embodiment, generate the initial power control indicator 201 based on a command from the host processor 1104 or any other suitable processor.

Figure 12:
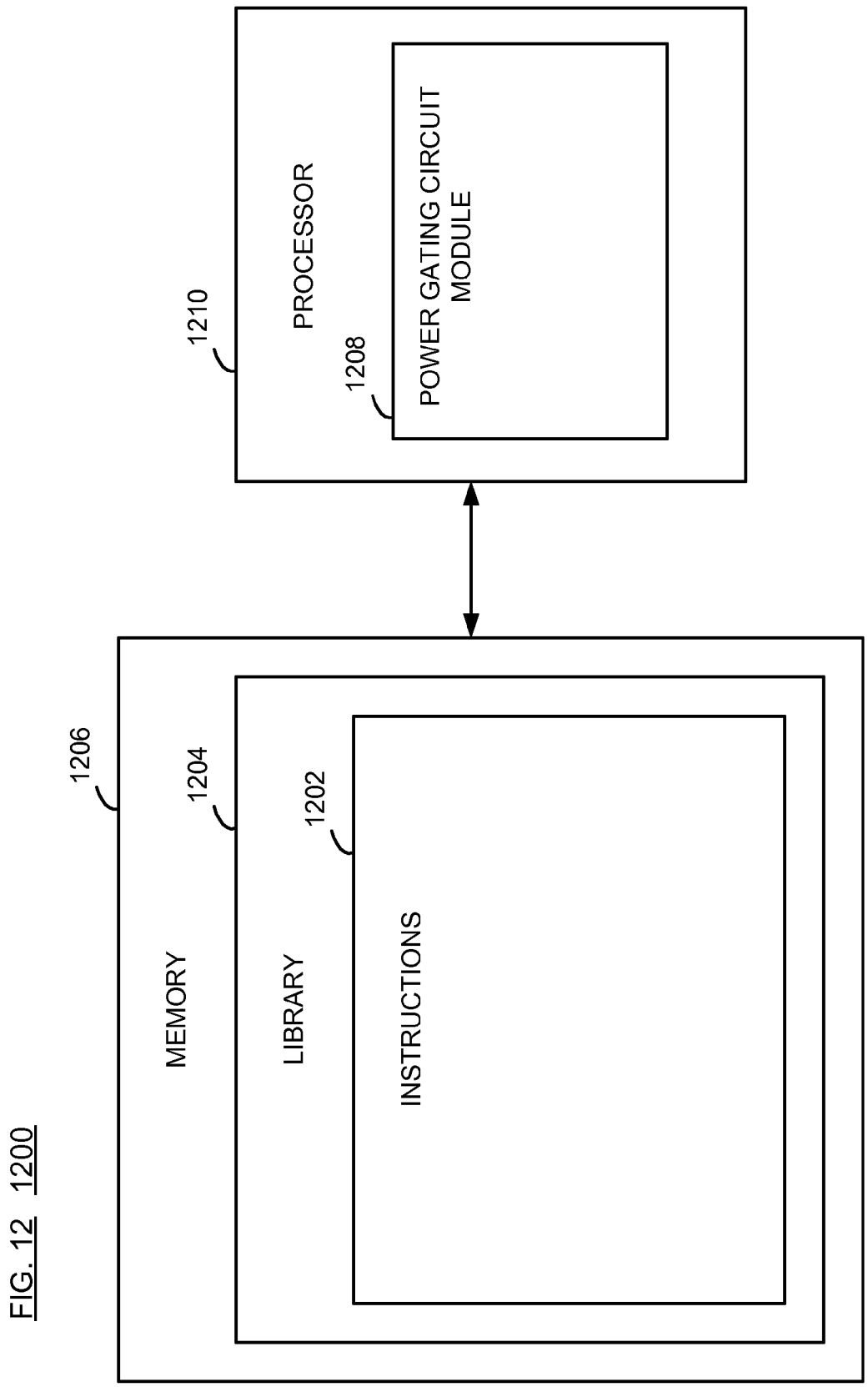
FIG. 12 illustrates a block diagram of an exemplary hardware design that may be used to implement one embodiment of the present disclosure.

FIG. 12 illustrates a block diagram 1200 of an exemplary hardware device design system 1200 that may be used to implement one embodiment of the present disclosure. To this end, as known by those of skill in the art, a set of executable instructions 1202 may be defined and stored within a library 1204 that in turn is stored in memory 1206. The instructions 1202, which may include instructions represented in any suitable hardware design language (HDL) including, but not limited to, Verilog or another hardware representation such as GDSII, can be used by the power gating circuit module 1208 that is executed by one or more processors 1210 of system 1200. Module 1208 is illustrated as being executed by the one or more processors 1210 and may correspond to, for example, any suitable hardware design application as known in the art. Using instructions 1202, system 1200 may be employed to create a suitable power gating circuit such as, for example, the circuit of FIG. 3 or any portion thereof. System 1200 and module 1208 may be any suitable system and circuit or device module as known to those skilled in the art. As further recognized, memory 1206 may be any suitable memory such a, but not limited to any suitable volatile or non-volatile memory device or memory devices such as, but not limited to, one or more: registers, system memory, frame buffer memory, flash memory, cache etc. In one embodiment, memory 1206 is a random access memory. Similarly, the one or more processors 1210 may be any suitable processor such as, but not limited to any suitable device or devices such as one or more programmable or non-programmable (e.g., dedicated): processors, processing engines, microprocessors, microcontrollers, digital signal processors, application specific integrated circuits, state machines, programmable logic arrays, or any suitable combination thereof.

What is claimed is:

1. A power gating circuit comprising:
at least one main power gate switch, wherein the at least one main power gate switch is operatively coupled to a first power rail and selectively operative to charge a partially charged secondary voltage rail based on a main power control indicator; and
an automatic voltage level detector operative to detect a feedback voltage level on the secondary voltage rail and to generate the main power control indicator based on: an initial power control indicator and the detected voltage level.

2. The circuit of claim 1, further comprising:
at least one soft start power gate switch, wherein the at least one soft start power gate switch is operatively coupled to the first power rail and operative to selectively and partially charge the secondary voltage rail based on the initial power control indicator.

3. The circuit of claim 2, wherein:
the at least one soft start power gate switch comprises a soft start PMOS transistor having a respective soft start PMOS gate width;
the at least one main power gate switch comprises a main PMOS transistor having a respective main PMOS gate width; and
the soft start PMOS gate width is smaller than the main PMOS gate width.

4. The circuit of claim 3, wherein:
the soft start PMOS transistor of the at least one soft start power gate switch has a gate terminal operatively coupled to a respective soft start buffer, wherein the soft start buffer operates to delay the receipt of the initial power control indicator; and
the main PMOS transistor of the at least one main power gate switch has a gate terminal operatively coupled to a respective main buffer, wherein the main buffer operates to delay the receipt of the main power control indicator.

5. The circuit of claim 4, wherein the soft start buffer and the main buffer comprises an even number of logical inverter circuits.

6. The circuit of claim 3 wherein:
the soft start PMOS transistor source terminal and the main PMOS transistor source terminal are operatively coupled to the first power rail;
the soft start PMOS transistor drain terminal and the main PMOS transistor drain terminal are operatively coupled to a secondary voltage rail;
the soft start PMOS transistor gate terminal is operatively coupled in a soft start daisy chain configuration to a successive soft start PMOS transistor gate terminal such that the soft start PMOS transistor gate terminal is operative to receive the initial power control indicator and wherein the successive soft start PMOS transistor gate terminal is operative to receive the initial power control indicator at a successive subsequent time based on the soft start daisy chain configuration; and
the main PMOS transistor gate terminal is operatively coupled in a main daisy chain configuration to a successive main PMOS transistor gate terminal such that the main PMOS transistor gate terminal is operative to receive the main power control indicator and wherein the successive main PMOS transistor gate terminal is operative to receive the main power control indicator at another successive subsequent time based on the main daisy chain configuration.

7. The circuit of claim 1, wherein the at least one main power gate switch is operative to charge the secondary voltage rail when the initial power control indicator represents an initial power up command and when the detected voltage level is greater than or equal to a predetermined voltage level.

8. The circuit of claim 7, wherein the predetermined voltage level of the secondary voltage rail is selected to reduce at least one of:
   a susceptibility of noise along the first power rail when charging the secondary voltage rail; and
   a susceptibility of one or more electromigration violations in the circuit when charging the secondary voltage rail.

9. The circuit of claim 1, wherein the automatic voltage level detector comprises:
   a diode connected PMOS transistor having a diode connected PMOS transistor gate terminal operatively coupled to a diode connected PMOS transistor drain terminal;
   a logical inverter circuit operative to generate an inverted initial power control indicator based on the initial power control indicator; and
   a logical NAND circuit selectively operative to generate the main power control indicator based on: the inverted initial power up indicator and a voltage level of the diode connected PMOS transistor drain terminal.

10. The circuit of claim 9, wherein the diode connected PMOS transistor is fabricated as a multi-fingered device having two or more gate fingers such that the automatic voltage level detector remains capable of generating the main power control indicator if at least one gate finger remains operational while the remaining gate fingers are not functioning.

11. The circuit of claim 1, wherein the automatic voltage level detector comprises:
   a first logical inverter circuit operative to generate an inverted initial power control indicator based on the initial power control indicator;
   a first diode connected PMOS transistor having a first diode connected PMOS transistor gate terminal operatively coupled to a first diode connected PMOS transistor drain terminal;
   a first keeper PMOS transistor having a first source terminal operatively coupled to the first diode connected PMOS transistor source terminal and to the secondary voltage rail and further having a first drain terminal operatively coupled to the first diode connected PMOS transistor drain terminal;
   a first logical NAND circuit selectively operative to generate a preliminary main power control indicator based on: the inverted initial power control indicator and a voltage level of the first diode connected PMOS transistor drain terminal;
   wherein a first keeper PMOS transistor gate terminal is operative to receive the preliminary main power control indicator;
   a second logical inverter circuit operative to generate an inverted preliminary main power control indicator based on the preliminary main power control indicator;
   a second diode connected PMOS transistor having a second diode connected PMOS transistor gate terminal operatively coupled to a second diode connected PMOS transistor drain terminal;
   a second keeper PMOS transistor having a second source terminal operatively coupled to the second diode connected PMOS transistor source terminal and to the secondary voltage rail and further having a second drain terminal operatively coupled to the second diode connected PMOS transistor drain terminal;
   a second logical NAND circuit selectively operative to generate the main power control indicator based on: the inverted preliminary main power control indicator and a voltage level of the second diode connected PMOS transistor drain terminal; and
   wherein a second keeper PMOS transistor gate terminal is operative to receive the main power control indicator.

12. A method for charging a voltage rail, the method comprising:
   receiving an initial power control indicator;
   automatically detecting a feedback voltage level on the voltage rail; and
   selectively charging a partially charged voltage rail based on the initial power control indicator and the detected voltage level.

13. The method of claim 12 further comprising, prior to selectively charging the partially charged voltage rail, selectively and partially charging the voltage rail based on the initial power control indicator.

14. The method of claim 12, wherein selectively charging the partially charged voltage rail based on the initial power control indicator and the detected voltage level comprises selectively charging the partially charged voltage rail when the initial power control indicator represents an initial power up command and when the detected voltage level is greater than or equal to a predetermined voltage level.

15. The method of claim 14 wherein the predetermined voltage level is selected to reduce at least one of:
   a susceptibility of noise along the first power rail when charging the voltage rail; and
   a susceptibility of one or more electromigration violations when charging the voltage rail.

16. A power gating circuit comprising:
   at least one main power gate switch, wherein the at least one main power gate switch is operatively coupled to a first power rail and selectively operative to charge a partially charged secondary voltage rail based on a main power control indicator;
   at least one automatic voltage level detector, wherein the at least one automatic voltage level detector is operative to detect a feedback voltage level on the secondary voltage rail and to generate an intermediate power control indicator based on: an initial power control indicator and the detected voltage level; and
   a confirmation circuit operative to generate the main power control indicator based on the intermediate power control indicator.

17. The circuit of claim 16, further comprising:
   at least one soft start power gate switch, wherein the at least one soft start power gate switch is operatively coupled to the first power rail and selectively operative to partially charge the secondary voltage rail based on the initial power control indicator;
   wherein the at least one soft start power gate switch comprises a soft start PMOS transistor having a respective soft start PMOS gate width;
   wherein the at least one main power gate switch comprises a main PMOS transistor having a respective main PMOS gate width; and
   wherein the soft start PMOS gate width is smaller than the main PMOS gate width.

18. The circuit of claim 17, wherein:

the soft start PMOS transistor source terminal and the main PMOS transistor source terminal are operatively coupled to the first power rail;

the soft start PMOS transistor drain terminal and the main PMOS transistor drain terminal are operatively coupled to the secondary voltage rail;

the soft start PMOS transistor gate terminal is operatively coupled in a soft start daisy chain configuration to a successive soft start PMOS transistor gate terminal such that the soft start PMOS transistor gate terminal is operative to receive the initial power control indicator and wherein the successive soft start PMOS transistor gate terminal is operative to receive the initial power control indicator at a successive subsequent time based on the soft start daisy chain configuration; and the main PMOS transistor gate terminal is operatively coupled in a main daisy chain configuration to a successive main PMOS transistor gate terminal such that the main PMOS transistor gate terminal is operative to receive the main power control indicator and wherein the successive main PMOS transistor gate terminal is operative to receive the main power control indicator at another successive subsequent time based on the main daisy chain configuration.

19. The circuit of claim 16, wherein the confirmation circuit comprises a logical OR circuit.

20. The circuit of claim 16, wherein the automatic voltage level detector comprises:

a diode connected PMOS transistor having a diode connected PMOS transistor gate terminal operatively coupled to a diode connected PMOS transistor drain terminal;

a logical inverter circuit operative to generate an inverted initial power control indicator based on the initial power control indicator; and a logical NAND circuit selectively operative to generate a respective intermediate power control indicator based on: the inverted initial power control indicator and a voltage level of the diode connected PMOS transistor drain terminal.

21. A method for charging a voltage rail, the method comprising:

receiving an initial power control indicator;

detecting a feedback voltage level on the voltage rail at two or more locations on the voltage rail; and selectively charging a partially charged voltage rail based on the initial power control indicator and the detected voltage level.

22. The method of claim 21 further comprising, prior to selectively charging the partially charged voltage rail, selectively and partially charging the voltage rail based on the initial power control indicator.

23. A computer system comprising:
a host processor;
memory coupled to the host processor;
a power supply; and
a circuit comprising:
a first power rail operatively coupled to the power supply;
at least one main power gate switch, wherein the at least one main power gate switch is operatively coupled to the first power rail and selectively operative to charge a partially charged secondary voltage rail based on a main power control indicator; and
an automatic voltage level detector operative to detect a feedback voltage level on the secondary voltage rail and to generate the main power control indicator based on an initial power control indicator and the detected voltage level.

24. The computer system of claim 23, wherein the circuit further comprises at least one soft start power gate switch, wherein the at least one soft start power gate switch is operatively coupled to the first power rail and selectively operative to partially charge the secondary voltage rail based on the initial power control indicator.

25. The computer system of claim 23, wherein the circuit is a component of the host processor.

26. The computer system of claim 23, further comprising a graphics processing unit coupled to the power supply and wherein the graphics processing unit comprises the circuit.

27. Memory storing instructions executable by one or more processors that causes the one or more processors to create a power gating circuit such that the power gating circuit is operative to:

receive an initial power control indicator;

automatically detect a feedback voltage level on a voltage rail; and selectively charge a partially charged voltage rail based on the initial power control indicator and the detected voltage level.

28. The memory of claim 27 wherein the instructions further cause the one or more processors to, prior to selectively charging the partially charged voltage rail, selectively and partially charge the voltage rail based on the initial power control indicator.

29. The memory of claim 27 wherein the instructions further cause the one or more processors to selectively charge the partially charged voltage rail based on the initial power control indicator and the detected voltage level by selectively charging the partially charged voltage rail when the initial power control indicator represents an initial power up command and when the detected voltage level is greater than or equal to a predetermined voltage level.

* * * * *